(12) United States Patent
Dong

(10) Patent No.: US 7,855,884 B2
(45) Date of Patent: Dec. 21, 2010

(54) COVER LATCH MECHANISM, LATCH, AND PORTABLE ELECTRONIC DEVICE USING SAME

(75) Inventor: Shui-Jin Dong, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 100 days.

(21) Appl. No.: 12/347,257

(22) Filed: Dec. 31, 2008

(65) Prior Publication Data

US 2009/0323291 A1    Dec. 31, 2009

(30) Foreign Application Priority Data

Jun. 27, 2008    (CN)    .................. 2008 1 0302389

(51) Int. Cl.
*H05K 5/00* (2006.01)
*H05K 7/00* (2006.01)

(52) U.S. Cl. .............................. 361/679.58; 361/679.56

(58) Field of Classification Search ............ 361/679.56, 361/679.58

See application file for complete search history.

(56) References Cited

U.S. PATENT DOCUMENTS

| | | | |
|---|---|---|---|
| 6,371,535 B2 * | 4/2002 | Wei et al. ..................... | 292/175 |
| 6,490,436 B1 * | 12/2002 | Kaiwa et al. ................ | 455/90.1 |
| 7,606,022 B2 * | 10/2009 | Kim ....................... | 361/679.01 |

* cited by examiner

*Primary Examiner*—Jayprakash N Gandhi
*Assistant Examiner*—Anthony M Haughton
(74) *Attorney, Agent, or Firm*—D. Austin Bonderer

(57) ABSTRACT

A latch mechanism used in a portable electronic device includes a housing member, a cover member, and a latching assembly. The cover member forms a claw, and the housing member defines a positioning hole. The latching assembly can be slidably mounted in the housing member and slides between a latched position and a released position. In the latched position, the cover member latches to the housing member. The latched position is maintained by entry of the claw into the positioning hole. In the released position, the cover member releases from the housing member, and the claw is released out of the positioning hole. During the sliding process, the latching assembly abuts and directly raises the cover member relative to the housing member from the latched position to the released position.

18 Claims, 5 Drawing Sheets

COVER LATCH MECHANISM, LATCH, AND PORTABLE ELECTRONIC DEVICE USING SAME

BACKGROUND

1. Field of the Invention

The invention relates to cover latch mechanisms used in portable electronic devices.

2. Description of Related Art

Portable electronic devices often include latches for securing battery covers thereof. The latch mechanisms must withstand numerous installations and removals of batteries.

A typical cover latch mechanism includes at least one spring to facilitate its operation. However, the spring wears out with repeated operation and, thus the cover latch mechanism may fail.

Therefore, there is room for improvement within the art.

BRIEF DESCRIPTION OF THE DRAWINGS

Many aspects of the exemplary battery cover latch mechanism, latch, and portable electronic device using the latch mechanism can be better understood with reference to the following drawings. These drawings are not necessarily drawn to scale, the emphasis instead being placed upon clearly illustrating the principles of the exemplary cover latch mechanism and the portable electronic device. Moreover, in the drawings like reference numerals designate corresponding parts throughout the several views. Wherever possible, the same reference numbers are used throughout the drawings to refer to the same or like elements of an embodiment.

DETAILED DESCRIPTION OF THE EXEMPLARY EMBODIMENTS

Figure 1:
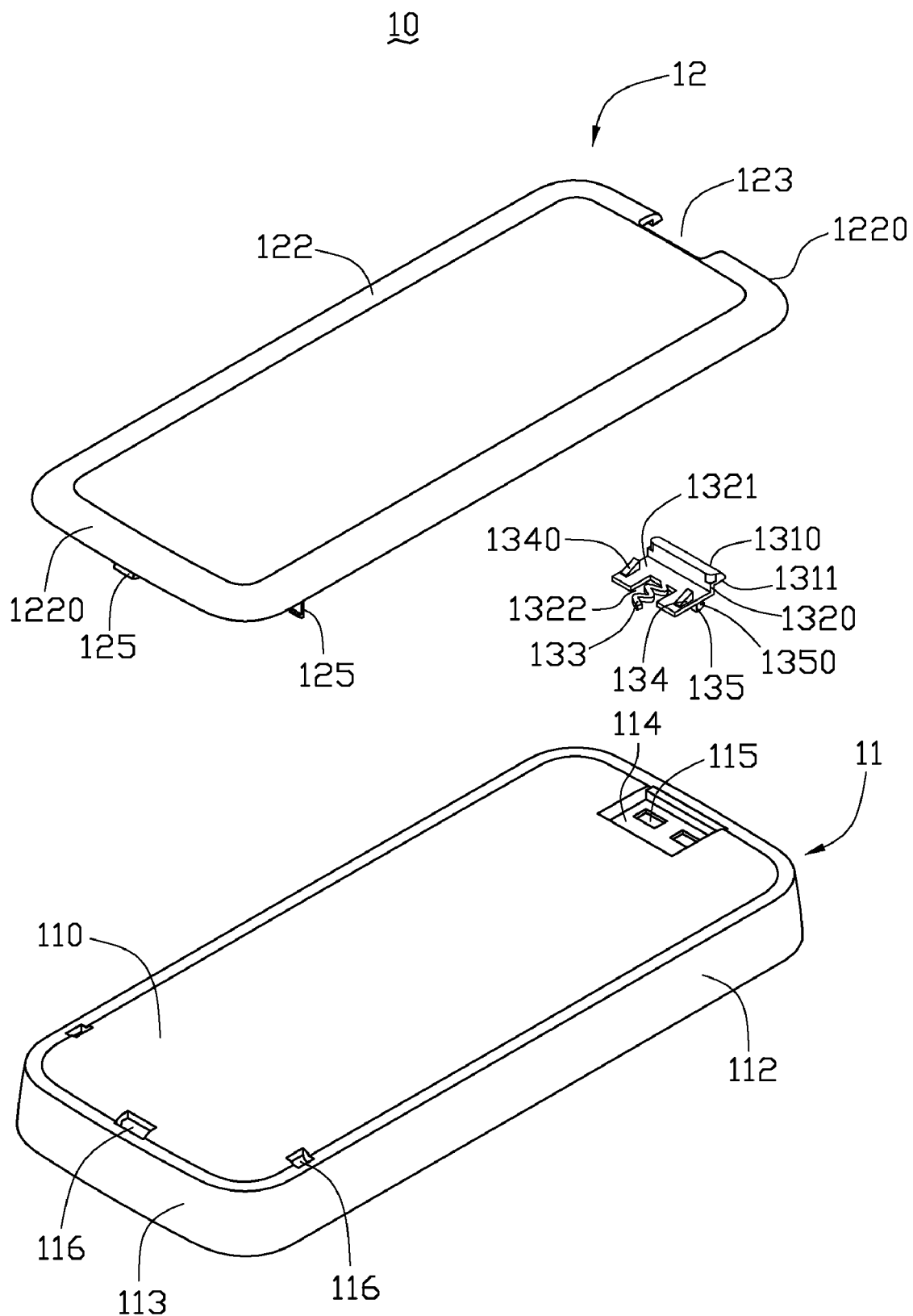
FIG. 1 is an isometric and exploded view of a cover latch mechanism used in a portable electronic device according to an exemplary embodiment.
Figure 2:
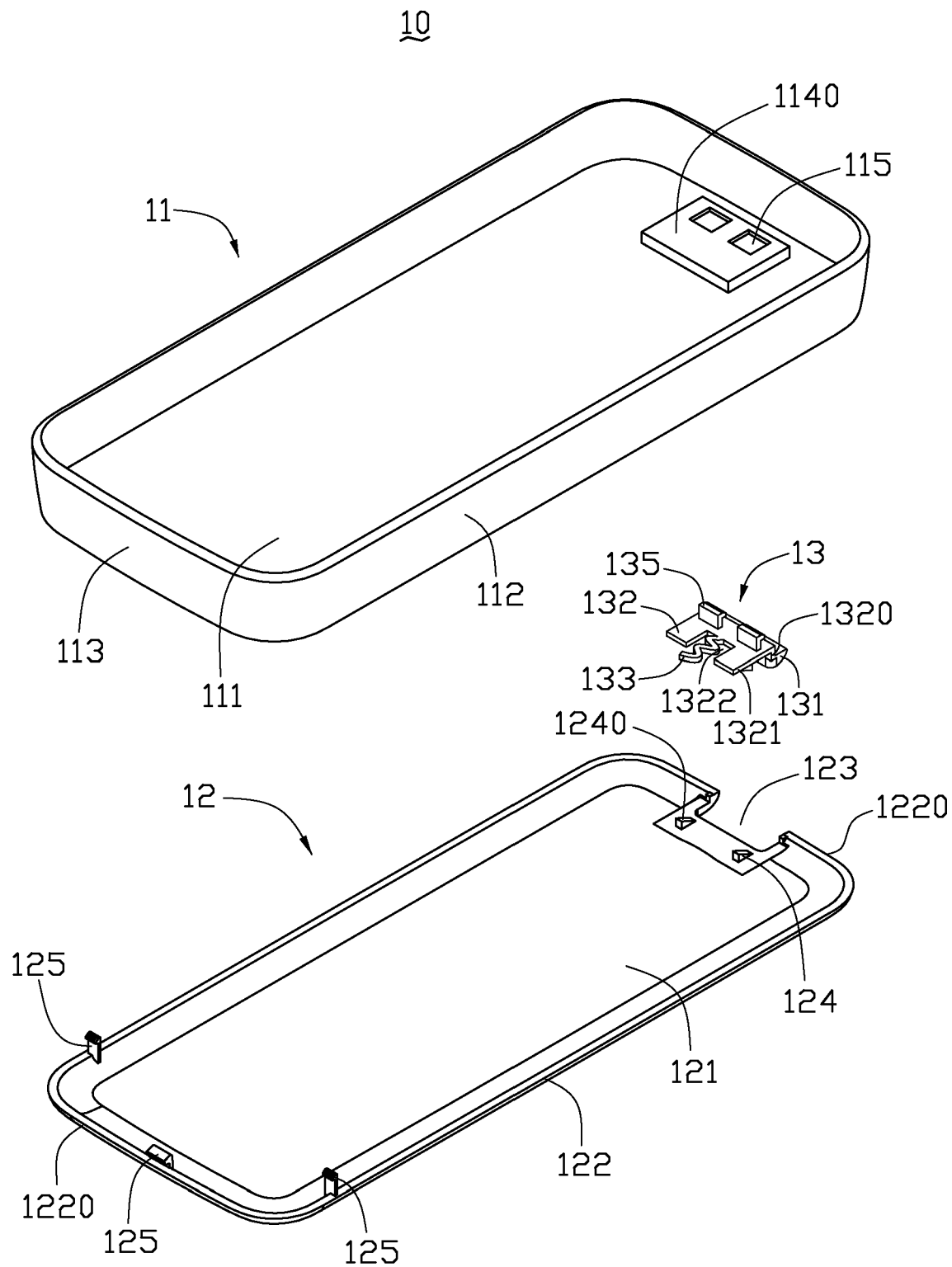
FIG. 2 is another exploded view of the cover latch mechanism shown in FIG. 1.

A latch mechanism is disclosed, for application with an electronic device. Such use can be, as described here, securing of a battery hatch cover, although the disclosure is not limited thereto. Further, the electronic device utilizing the latch mechanism, while disclosed here as a mobile phone, can conceivably be any electronic device with a securable hatch, while remaining well within the scope of the disclosure. FIGS. 1 and 2 show a cover latch mechanism 10 used in a portable electronic device, here, a mobile phone. The cover latch mechanism 10 includes a housing member 11, a cover member 12, and a latching assembly 13. The housing member 11 can be a housing of the portable electronic device. The cover member 12 can be a cover of the portable electronic device. The latching assembly 13 is slidably mounted between the housing member 11 and the cover member 12, providing latching/releasing of the cover member 12 relative to the housing member 11.

Referring to FIGS. 1 and 2, the housing member 11 includes an exterior wall 110, an interior wall 111, two opposite sidewalls 112, and two opposite end walls 113. The interior wall 111 forms a generally rectangular protrusion 1140 adjacent to one of the two end walls 113 (see FIG. 2). The protrusion 1140 defines a receiving cavity 114 through the exterior wall 110, and two latching holes 115 through the exterior wall 110 and the interior wall 111 (best seen in FIG. 1). Three adjacent positioning holes 116 are defined in the exterior wall 110, of which one is located adjacent to the other opposite end wall 113 and the other two are positioned adjacent to the two sidewalls 112.

The cover member 12 includes a bottom wall 121 and a peripheral wall 122 (shown in FIG. 2). One end portion 1220 of the peripheral wall 122 defines a generally rectangular notch 123 corresponding to the receiving cavity 114, the other opposite end portion 1220 of the peripheral wall 122 forms three adjacent, generally L-shaped claws 125 corresponding to the positioning holes 116. The claws 125 are configured to latch into the positioning holes 113 facilitating fixing of the cover member 12 to the housing member 11. One of the three claws 125 is on a distal end of the end portion 1220, and the other two of the three claws 125 are on two opposite side ends of the end portion 1220. The bottom wall 121 provides two wedge-shaped sliding blocks 124 near the notch 116. The sliding blocks 124 include two inclined sliding walls 1240 towards the notch 116.

The latching assembly 13 may be integrally formed including a contact member 131, a generally rectangular mounting panel 132, a curled elastic member 133, two wedge-shaped resisting members 134 corresponding to the sliding blocks 124, and two L-shaped latching members 135. The mounting panel 132 has a first planar end portion 1320 vertically connecting the contact member 131, and a second concaved end portion 1321 horizontally connecting the elastic member 133. The second concaved end portion 1321 is defined with a cutout 1322. The elastic member 133 opposite to the contact member 131 is received within the cutout 1322.

The resisting members 134 and the contact member 131 are positioned on the same side of the mounting panel 132. The resisting members 134 are further positioned on two sides of the elastic member 133 (best seen in FIG. 1). The resisting members 134 include two inclined resisting walls 1340 reversed to the contact member 131. The resisting walls 1340 correspond to the sliding walls 1240 and are configured to slidably engage the sliding walls 1240.

Figure 3:
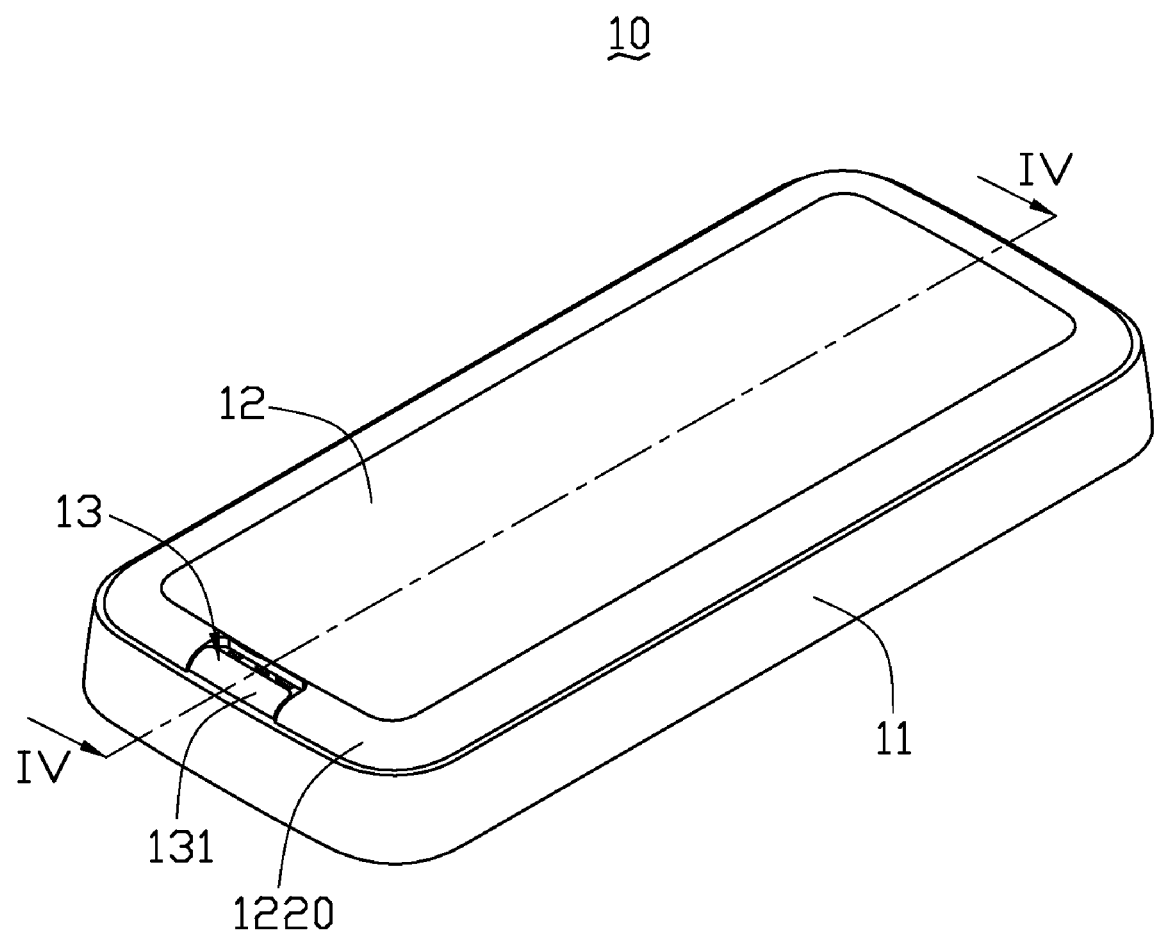
FIG. 3 is an assembled view relative to FIG. 1, showing a cover latch deployed in an electronic device, in a latched position.
Figure 4:
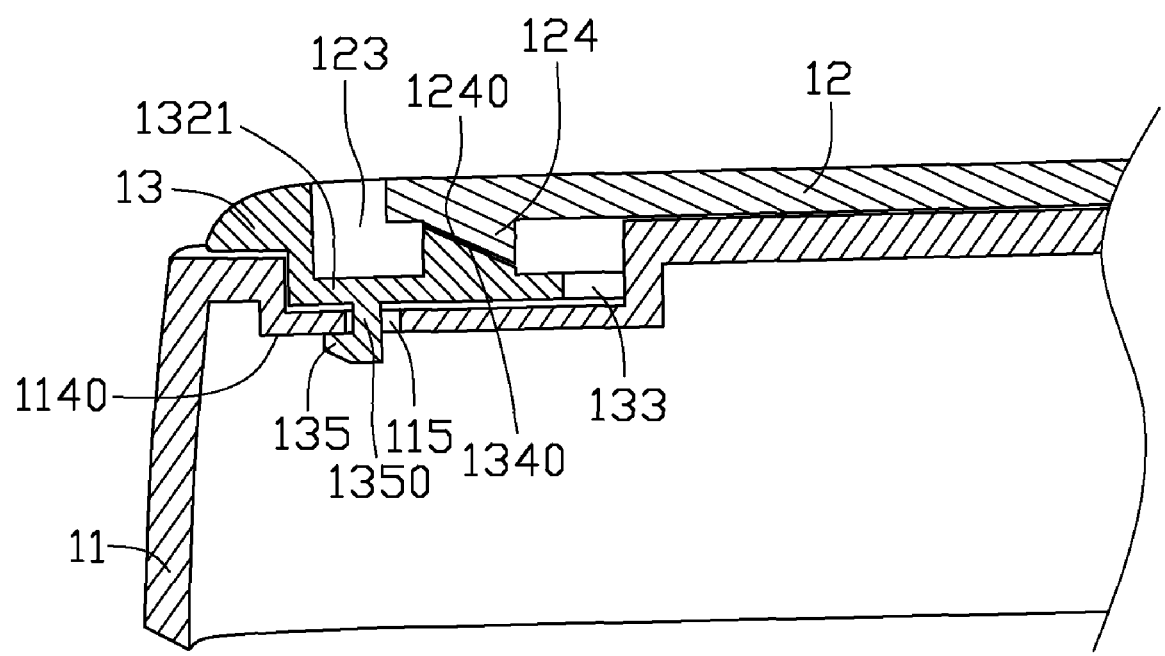
FIG. 4 is a cross-section of the cover latch of FIG. 3, taken along line IV-IV.

Referring to FIGS. 3 and 4, the cover latch mechanism 10 maintains its latched position. In this position, the cover member 12 latches to the housing member 11 by entry of the claws 125 into the positioning holes 116. In this case, the latching assembly 13 can be partially received in the receiving cavity 114. The contact member 131 is accordingly exposed inside the notch 123 of the cover member 12 and thus is slidable within the notch 123. The resisting walls 1340 slidably engage the sliding walls 1240. The latching assembly 13 is further secured in the receiving cavity 114 by entry of the latching members 135 into the latching hole 115. The elastic member 133 maintains its relaxed (i.e., un-deformed/compressed) state.

Removing the cover member 12 from the housing member 11, i.e., from the latched position (shown in FIG. 4) to a released position (shown in FIG. 5), requires pressing the contact member 131 to release the entry of the cover latch mechanism 100. During this stage, the contact member 131 slides further into the notch 123. The elastic member 133 abuts and then is compressed by the inside wall of the receiving cavity 114. Simultaneously, the resisting members 134 move to slide the resisting walls 1340 along the sliding walls 1240 and thus raise the sliding blocks 124 and the cover member 12 upwardly away from the housing member 11. After that, the cover member 11 can be easily detached from the housing member 12 by removal of the claws 125 from the positioning holes 116. Additionally, due to the size of the latching members 135 exceeding that of the latching holes 115, the latching members 135 cannot dislodge from the latching holes 115, and, accordingly, the latching assembly 13 cannot dislodge from the receiving cavity 114. By further release of the contact member 131, the compressed elastic member 133 returns to its relaxed state to impel the whole latching assembly 13 to its former latched position.

It is to be understood that the described releasing process can be reversed to re-latch the cover member 11 to the housing member 12.

Figure 5:
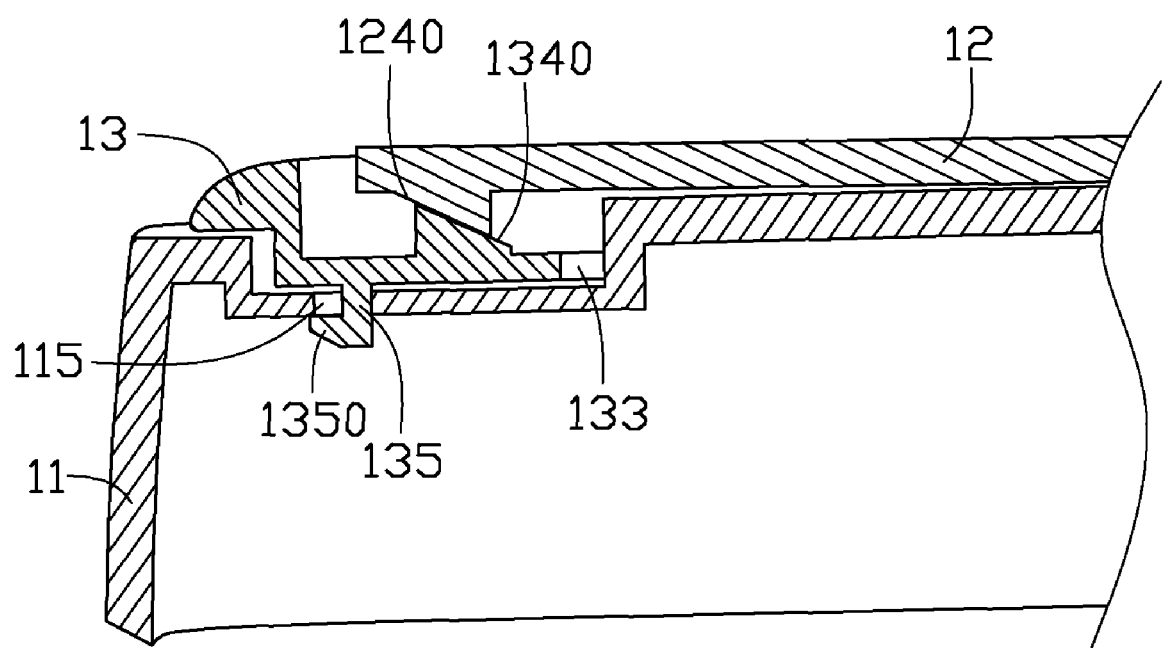
FIG. 5 is similar to FIG. 4 but shows the cover latch in a released position.

Also disclosed, as shown in FIGS. 3-5, is a latch utilizing the disclosed latch mechanism, and an electronic device utilizing the disclosed latch mechanism in a latch.

It is to be understood, however, that even through numerous characteristics and advantages of the exemplary invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cover latch mechanism, comprising:
   a cover member forming a claw;
   a housing member defining a positioning hole and a latching hole, the housing member configured to be latched to or released from the cover member; and
   a latching assembly slidably mounted in the housing member and configured for sliding between:
     a latched position wherein the cover member latches to the housing member, the latched position maintained by entry of the claw into the positioning hole; and
     a released position wherein the cover member releases from the housing member, the claw released out of the positioning hole; and
   further configured for, during the sliding process, moving towards the claw, abutting and directly raising the cover member relative to the housing member from the latched position to the released position;
   the latching assembly comprising a latching member, the latching member latching into and not being dislodged from the latching hole between the latched position and the released position.

2. The cover latch mechanism as claimed in claim 1, wherein the latching assembly comprises a resisting member, the cover member comprises a sliding block, the resisting member comprises a resisting wall, the sliding block comprises a sliding wall, the resisting wall slidably engaging with sliding wall and raising the cover member and the sliding block during sliding of the latching assembly.

3. The cover latch mechanism as claimed in claim 2, wherein the resisting wall and the sliding wall are both inclined and configured for moving with each other.

4. The cover latch mechanism as claimed in claim 2, wherein the latching assembly further comprises a mounting panel, on two opposite sides of which the latching member and the resisting member are formed.

5. The cover latch mechanism as claimed in claim 4, wherein the latching assembly further comprises an elastic member and is biased thereby towards the latched position.

6. The cover latch mechanism as claimed in claim 5, wherein the latching assembly further comprises a contact member positioned with the elastic member on two opposite ends of the mounting panel, the contact member facilitating impelling of the latching assembly towards the released position.

7. The cover latch mechanism as claimed in claim 1, wherein the housing member defines a receiving cavity, the cover member defines a notch, the latching assembly comprising a contact member, wherein the latching assembly is slidably mounted into the receiving cavity with the contact member exposed, and the contact member is received inside the notch in the latched position and is movable within the notch from the latched position to the released position.

8. The cover latch mechanism as claimed in claim 7, wherein the claw is L-shaped and formed opposite to the notch, and the positioning hole is defined opposite to the receiving cavity.

9. The cover latch mechanism as claimed in claim 8, wherein the elastic member is coiled.

10. A cover latch, comprising:
    a cover member forming a claw;
    a housing member defining a positioning hole and a latching hole; and
    a latching assembly slidably mounted between the housing member and the cover member, the latching assembly configured for sliding between:
      a latched position wherein the cover member latches to the housing member, the latched position maintained by entry of the claw into the positioning hole; and
      a released position wherein the cover member releases from the housing member, the claw released out of the positioning hole; and
    further configured for, during the sliding process, moving towards the claw, abutting and directly raising the cover member relative to the housing member from the latched position to the released position;
    the latching assembly comprising a latching member, the latching member latching into and not being dislodged from the latching hole between the latched position and the released position.

11. The cover latch as claimed in claim 10, wherein the latching assembly comprises a resisting member, the cover member comprises a sliding block, the resisting member comprises a resisting wall, the sliding block comprises a sliding wall, the resisting wall slidably engaging with sliding wall and raising the cover member and the sliding block during sliding of the latching assembly.

12. The cover latch as claimed in claim 11, wherein the resisting wall and the sliding wall are both inclined and configured for moving with each other.

13. The cover latch as claimed in claim 11, wherein the latching assembly further comprises a mounting panel, on two opposite sides of which the latching member and the resisting member are formed.

14. The cover latch as claimed in claim 13, wherein the latching assembly further comprises an elastic member and is biased thereby towards the latched position.

15. The cover latch as claimed in claim 14, wherein the latching assembly further comprises a contact member positioned with the elastic member on two opposite ends of the mounting panel, the contact member facilitating impelling of the latching assembly towards the released position.

16. The cover latch as claimed in claim 10, wherein the housing member defines a receiving cavity, the cover member defines a notch, the latching assembly comprising a contact member, wherein the latching assembly is slidably mounted into the receiving cavity with the contact member exposed, and the contact member is received inside the notch in the latched position and is movable within the notch from the latched position to the released position.

17. The cover latch as claimed in claim 16, wherein the claw is L-shaped and formed opposite to the notch, and the positioning hole is defined opposite to the receiving cavity.

18. A portable electronic device utilizing a cover latch, the latch comprising:
- a cover member forming a claw;
- a housing member defining a positioning hole and a latching hole; and
- a latching assembly slidably mounted in the housing member and configured for sliding between:
  - a latched position wherein the cover member latches to the housing member, the latched position maintained by entry of the claw into the positioning hole; and
  - a released position wherein the cover member releases from the housing member, the claw released out of the positioning hole; and
- further configured for, during the sliding process, moving towards the claw, abutting and directly raising the cover member relative to the housing member from the latched position to the released position;
- the latching assembly comprising a latching member, the latching member latching into and not dislodging from the latching hole between the latched position and the released position.

* * * * *